United States Patent
Tschumakow et al.

(10) Patent No.: US 9,947,760 B2
(45) Date of Patent: Apr. 17, 2018

(54) METHOD FOR MANUFACTURING AN EMITTER FOR HIGH-SPEED HETEROJUNCTION BIPOLAR TRANSISTORS

(71) Applicant: Infineon Technologies Dresden Gmbh, Dresden (DE)

(72) Inventors: Dmitri Alex Tschumakow, Dresden (DE); Claus Dahl, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/616,991

(22) Filed: Jun. 8, 2017

(65) Prior Publication Data
US 2017/0365687 A1 Dec. 21, 2017

(30) Foreign Application Priority Data
Jun. 16, 2016 (DE) .......... 10 2016 210 791

(51) Int. Cl.
*H01L 21/331* (2006.01)
*H01L 29/66* (2006.01)
*H01L 29/08* (2006.01)
*H01L 29/737* (2006.01)

(52) U.S. Cl.
CPC .... *H01L 29/66242* (2013.01); *H01L 29/0804* (2013.01); *H01L 29/0817* (2013.01); *H01L 29/66234* (2013.01)

(58) Field of Classification Search
CPC .............. H01L 29/66234–29/66348; H01L 29/73–29/7378
See application file for complete search history.

(56) References Cited

U.S. PATENT DOCUMENTS
2010/0047987 A1* 2/2010 Donkers ......... H01L 29/6625
438/318

FOREIGN PATENT DOCUMENTS
WO WO 2006/114753 11/2006

\* cited by examiner

*Primary Examiner* — Daniel Shook
(74) *Attorney, Agent, or Firm* — Harrity & Harrity, LLP

(57) ABSTRACT

A method for manufacturing a bipolar junction transistor is provided. A layer stack is provided that comprises a semiconductor substrate having a trench isolation; an isolation layer arranged on the semiconductor substrate, wherein the first isolation layer comprises a recess forming an emitter window; lateral spacers arranged on sidewalls of the emitter window; a base layer arranged in the emitter window on the semiconductor substrate; and an emitter layer arranged on the isolation layer, the lateral spacers and the base layer. A sacrificial layer is provided on the emitter layer thereby overfilling a recess formed by the emitter layer due to the emitter window. The sacrificial layer is selectively removed up to the emitter layer while maintaining a part of the sacrificial layer filling the recess of the emitter layer. The emitter layer is selectively removed up to the isolation layer while maintaining the filled recess of the emitter layer.

12 Claims, 13 Drawing Sheets

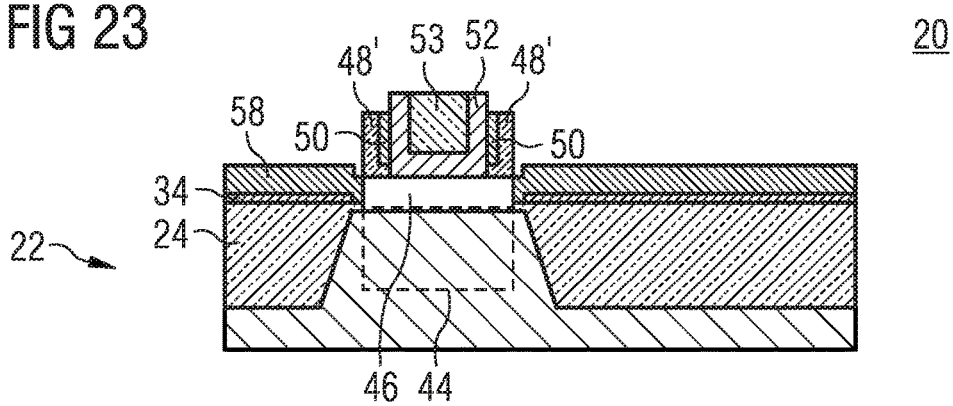
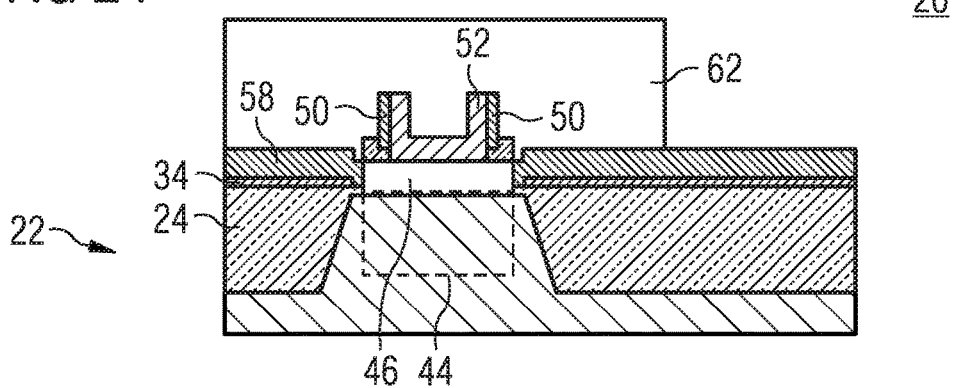
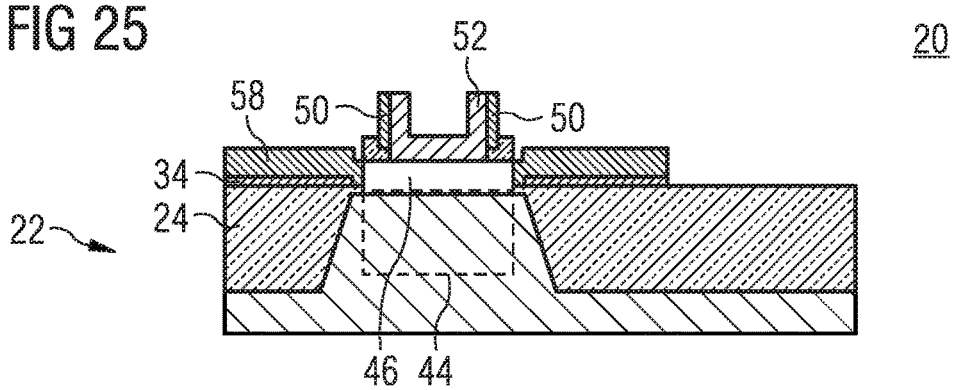

┌─────────────────────────────────────────────────────────┐
│ providing a layer stack, the layer stack comprising:    │
│ - a semiconductor substrate having a trench isolation;  │
│ - an isolation layer arranged on the semiconductor      │
│   substrate, wherein the first isolation layer          │
│   comprises a recess forming an emitter window;         │──82
│ - lateral spacers arranged on sidewalls of the          │
│   emitter window;                                       │
│ - a base layer arranged in the emitter window on the    │
│   semiconductor substrate; and                          │
│ - an emitter layer arranged on the isolation layer,     │
│   the lateral spacers and the base layer;               │
└─────────────────────────────────────────────────────────┘
                            │
                            ▼
┌─────────────────────────────────────────────────────────┐
│ providing a sacrificial layer on the emitter layer      │
│ thereby overfilling a recess formed by the emitter      │──84
│ layer due to the emitter window;                        │
└─────────────────────────────────────────────────────────┘
                            │
                            ▼
┌─────────────────────────────────────────────────────────┐
│ selectively removing the sacrificial layer up to the    │
│ emitter layer while maintaining a part of the           │──86
│ sacrificial layer filling the recess of the emitter     │
│ layer; and                                              │
└─────────────────────────────────────────────────────────┘
                            │
                            ▼
┌─────────────────────────────────────────────────────────┐
│ selectively removing the emitter layer up to the        │
│ isolation layer while maintaining the filled recess     │──88
│ of the emitter layer.                                   │
└─────────────────────────────────────────────────────────┘
```

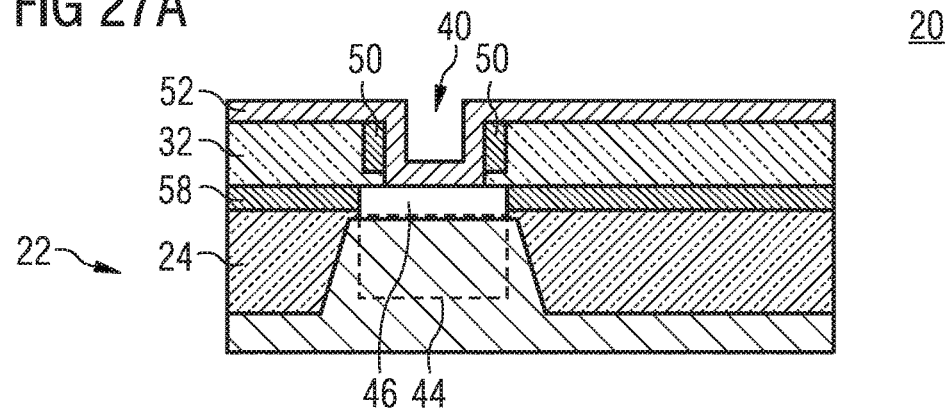
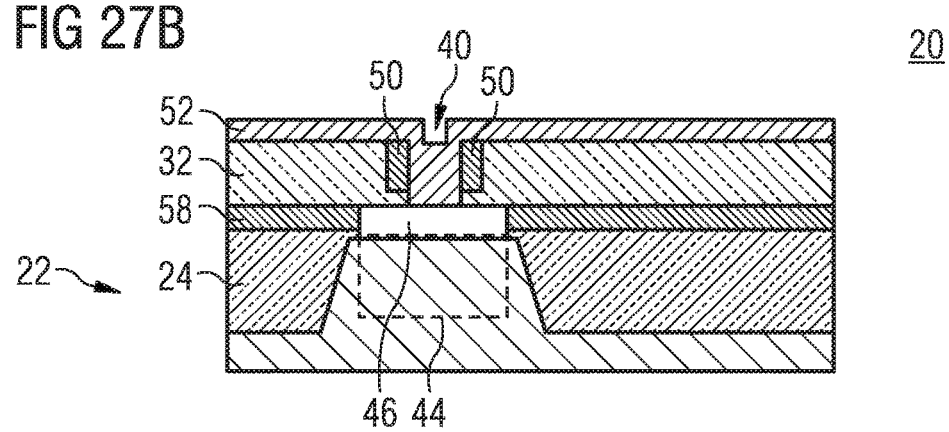
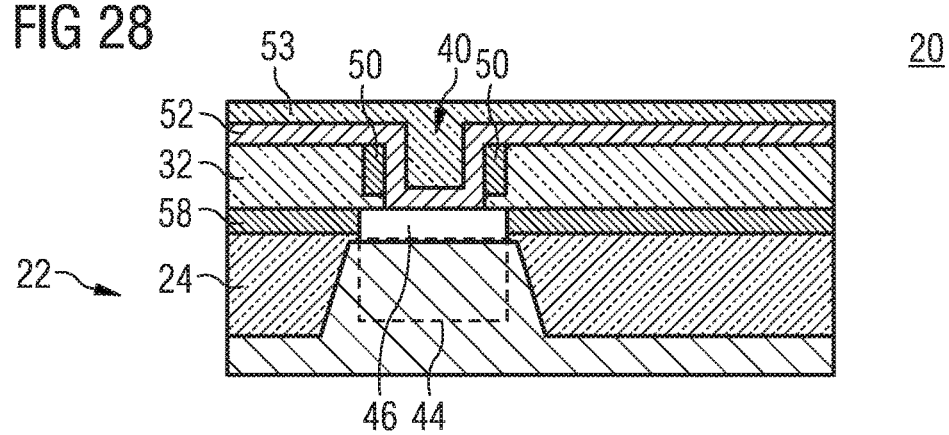

… # METHOD FOR MANUFACTURING AN EMITTER FOR HIGH-SPEED HETEROJUNCTION BIPOLAR TRANSISTORS

RELATED APPLICATION

This application claims priority under 35 U.S.C. § 119 to German Patent Application No. 102016210791.7, filed on Jun. 16, 2016, the content of which is incorporated by reference herein in its entirety.

TECHNICAL FIELD

Embodiments relate to a method for manufacturing a bipolar junction transistor. Further embodiments relate to a method for manufacturing an emitter for high-speed heterojunction bipolar transistors.

BACKGROUND

HBT transistors are used in many applications, such as signal generators in car RADAR (RAdio Detection And Ranging) or similar microwave applications, requiring high switching frequencies. To improve the figure of merit maximum switching frequency (fmax), it is important to reduce the amount of parasitic resistances and capacitances as well as keeping the base width of the transistor at the minimum value possible. At the same time, manufacturing costs should be kept low.

SUMMARY

Embodiments provide a method for manufacturing a bipolar junction transistor. In a first step, a layer stack is provided that comprises a semiconductor substrate having a trench isolation; an isolation layer arranged on the semiconductor substrate, wherein the first isolation layer comprises a recess forming an emitter window; lateral spacers arranged on sidewalls of the emitter window; a base layer arranged in the emitter window on the semiconductor substrate; and an emitter layer arranged on the isolation layer, the lateral spacers and the base layer. In a second step, a sacrificial layer is provided on the emitter layer thereby overfilling a recess formed by the emitter layer due to the emitter window. In a third step, the sacrificial layer is selectively removed up to the emitter layer while maintaining a part of the sacrificial layer filling the recess of the emitter layer. In a fourth step, the emitter layer is selectively removed up to the isolation layer while maintaining the filled recess of the emitter layer.

BRIEF DESCRIPTION OF THE DRAWINGS

FIG. 23 shows a schematic cross-sectional view of the bipolar junction transistor during manufacturing after the step of providing a base contact layer on the seed layer and the exposed part of the oxide layer, such that the cavities are filled and the base layer laterally contacted;

FIG. 24 shows a cross-sectional view of the bipolar junction transistor during manufacturing after the step of providing a structured mask layer on the emitter and parts of the base contact layer;

FIG. 25 shows a cross-sectional view of the bipolar junction transistor during manufacturing after the step of selectively removing parts of the base contact layer that are not covered by the structured mask layer, and selectively removing the structured mask layer;

FIG. 26 shows a flowchart of a method for manufacturing a bipolar junction transistor, according to an embodiment;

FIG. 27A shows a schematic cross-sectional view of the bipolar junction transistor during manufacturing after the step of providing the layer stack;

FIG. 27B shows a schematic cross-sectional view of the bipolar junction transistor during manufacturing after the step of providing the layer stack;

FIG. 28 shows a schematic cross-sectional view of the bipolar junction transistor during manufacturing after the step of providing a sacrificial layer on the emitter layer thereby overfilling a recess formed by the emitter layer due to the emitter window;

DETAILED DESCRIPTION

Figure 1:
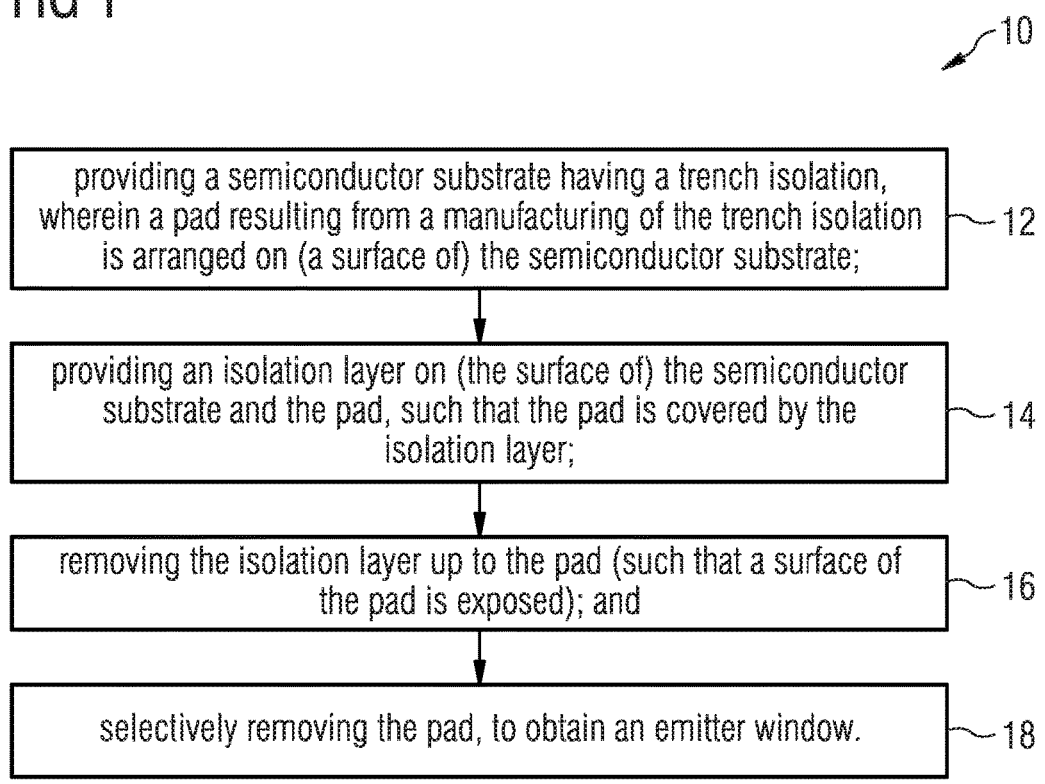
FIG. 1 shows a flowchart of a method for manufacturing a bipolar junction transistor, according to an embodiment.

Below, embodiments of the present invention will subsequently be discussed referring to the enclosed figures, wherein identical reference numerals are provided to objects or elements having the same or similar function so that the description thereof is mutually applicable and interchangeable.

FIG. 1 shows a flowchart of a method 10 for manufacturing a bipolar junction transistor. A first step 12 comprises providing a semiconductor substrate having a trench isolation, wherein a pad resulting from a manufacturing of the trench isolation is arranged on the semiconductor substrate. A second step 14 comprises providing an isolation layer on the semiconductor substrate and the pad, such that the pad is covered by the isolation layer. A third step 16 comprises removing the isolation layer up to the pad. A fourth step 18 comprises selectively removing the pad, to obtain an emitter window.

In embodiments, the pad (e.g., nitride pad), which results from the manufacturing of the trench isolation (e.g., STI (Shallow Trench Isolation)) and which is thus naturally tightly self-aligned to the boundaries of the trench isolation within the semiconductor substrate defines the collector region between the trench isolation. This pad is also used for defining the emitter window.

In other words, the emitter window can be created by utilizing the remaining pad nitride after the shallow-trench processing as an auxiliary structure to define the emitter window, instead of just etching it away.

Subsequently, embodiments of the method 10 for manufacturing a bipolar junction transistor are described in which exemplarily a heterojunction bipolar transistor is manufactured making reference to FIGS. 1 to 25 which show cross-sectional views of the heterojunction bipolar transistor after different manufacturing steps. Thereby, the collector sinker is not shown for simplicity reasons. Further, a standard buried-layer based construction can be used.

Figure 2:
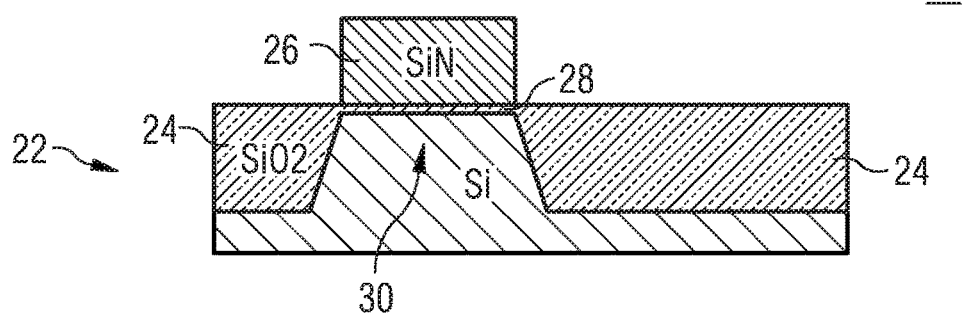
FIG. 2 shows a schematic cross-sectional view of the bipolar junction transistor during manufacturing after the step of providing a semiconductor substrate.

FIG. 2 shows a schematic cross-sectional view of the bipolar junction transistor 20 during manufacturing after the step of providing a semiconductor substrate 22. The semiconductor substrate (e.g., Si substrate) comprises a trench isolation (e.g., STI) 24 indicated in the cross-sectional view of FIG. 2 by two trenches 24.

Further, a pad (e.g., a SiN pad) 26 resulting from a manufacturing of the trench isolation 24 is arranged on the semiconductor substrate 22. In detail, for manufacturing the trench isolation an oxide layer 28, a nitride layer 26 and a mask layer (e.g., photo resist) may be provided (e.g., deposited) on the semiconductor substrate 22, wherein the mask layer may be partially opened to partially remove the nitride layer 26 and to etch the trenches into the semiconductor substrate 22 while maintaining the nitride pad 26 which is covered by the mask layer. An isolation layer (e.g., SiO2) may be provided on the semiconductor substrate 22 such that an overfill of the trenches is achieved. Afterwards the isolation layer can be planarized and recessed while maintaining the pad 26.

In other words, the so-called shallow trench insulation (STI) module can be conducted in a typical way. The trenches 24 can be etched, filled with insulator (typically oxide), planarized and then the remaining oxide can be recessed (typically dry etching). Conventionally, the next step is to remove the pad nitride 26, but this is not done.

Thus, the pad 26, which results from the manufacturing of the trench isolation 24 and which is thus already (self-) aligned with a collector implant region 30 and/or the boundaries of the trench isolation within the semiconductor substrate 22 between the trench isolation 24, can be used for defining the emitter window.

Figure 3:
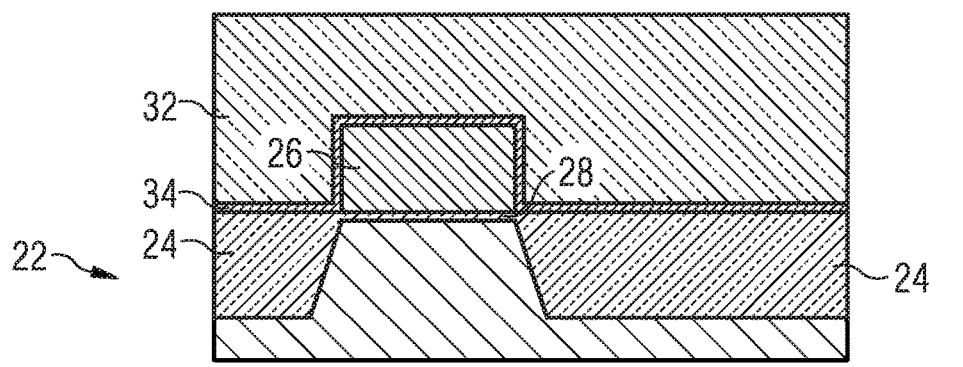
FIG. 3 shows a schematic cross-sectional view of the bipolar junction transistor during manufacturing after the step of providing an isolation layer on the semiconductor substrate and the pad, such that the pad is covered by the isolation layer.

FIG. 3 shows a schematic cross-sectional view of the bipolar junction transistor 20 during manufacturing after the step of providing an isolation layer 32 on the semiconductor substrate 22 (or more precisely, on the oxide layer 28) and the pad 26, such that the pad 26 is covered by the isolation layer 32.

As shown in FIG. 3, an optional seed layer 34 can be provided on the semiconductor substrate 22 (or more precisely, on the oxide layer 28) and the pad 26, such that the pad 26 is covered by the seed layer, wherein the isolation layer 32 is provided on the seed layer 34.

For example, a seed layer 34 (e.g., thin poly Si layer) followed by an isolation layer (e.g., oxide layer) 32 can be deposited.

Figure 4:
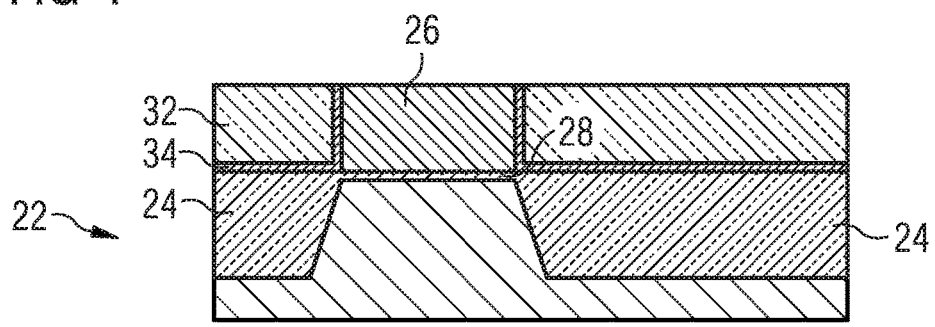
FIG. 4 shows a schematic cross-sectional view of the bipolar junction transistor during manufacturing after the step of removing the isolation layer up to the pad, such that a surface of the pad is exposed.

FIG. 4 shows a schematic cross-sectional view of the bipolar junction transistor 20 during manufacturing after the step of removing the isolation layer 32 (and the optional seed layer 34) up to the pad 26, such that (a surface of) the pad 26 is exposed.

For example, the isolation layer (e.g., oxide) 32 can be planarized by CMP (Chemical Mechanical Polishing) and the seed layer (e.g., poly) 34 on top of the nitride block 26 can be removed by etching.

Figure 5:
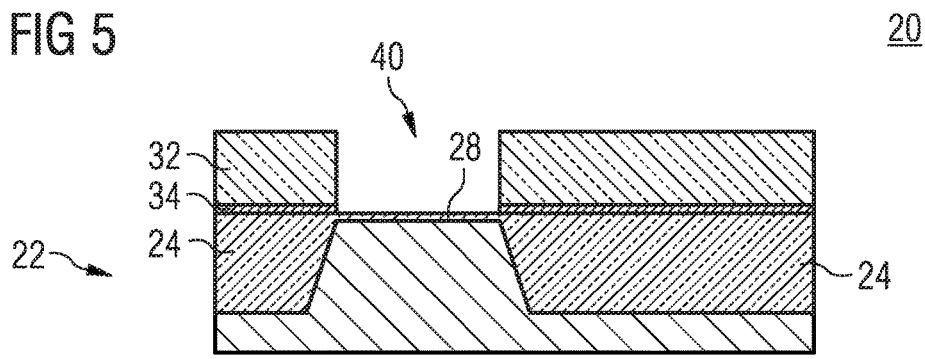
FIG. 5 shows a schematic cross-sectional view of the bipolar junction transistor during manufacturing after the step of selectively removing the pad, to obtain an emitter window.

FIG. 5 shows a schematic cross-sectional view of the bipolar junction transistor 20 during manufacturing after the step of selectively removing the pad 26, to obtain an emitter window 40.

Further, the optional seed layer 34, which is exposed within the emitter window 40 (on sidewalls of the emitter window 40) after removing the pad 26, can be selectively removed.

For example, the nitride block 26 and the seed layer 34 (e.g., vertical poly liners) can be removed, e.g., by wet etch. The resulting hole in the isolation layer (e.g., oxide) 32 may serve as emitter window 40. This emitter window 40 is (perfectly) self-aligned to the edges of the active Si area and its manufacturing did not require an additional lithographic step.

Figure 6:
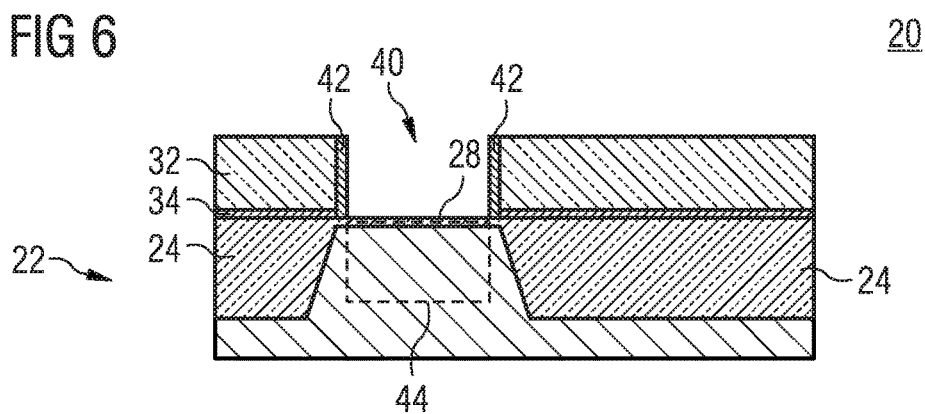
FIG. 6 shows a schematic cross-sectional view of the bipolar junction transistor during manufacturing after the step of providing lateral spacers on sidewalls of the emitter window.

FIG. 6 shows a schematic cross-sectional view of the bipolar junction transistor 20 during manufacturing after the step of providing lateral spacers 42 on sidewalls of the emitter window 40.

Thereby, the lateral spacers 42 can be provided on sidewalls of the emitter window 40 such that the lateral spacers 42 laterally cover the seed layer 34 that ends in the emitter window 40.

For example, the lateral spacers (e.g., thin nitride spacers) 42 can be fabricated by a combination of film deposition and subsequent anisotropic etch. This is a so-called collector-base spacer. Also the collector implantation 44 can be performed.

Figure 7:
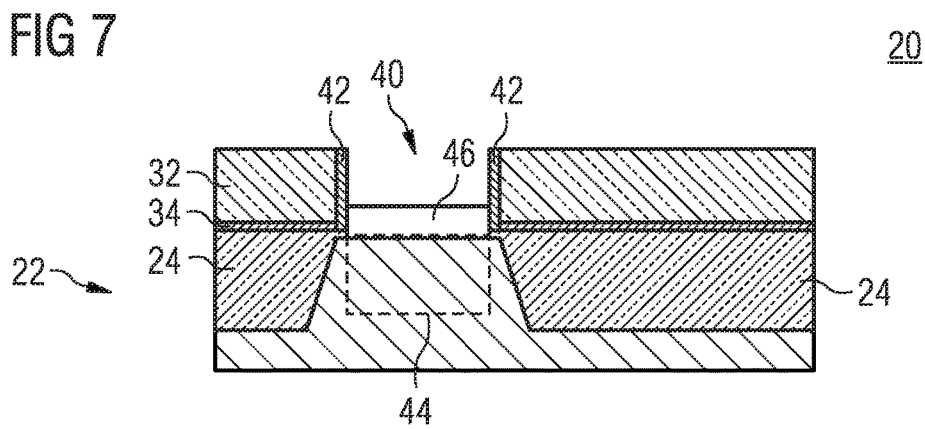
FIG. 7 shows a schematic cross-sectional view of the bipolar junction transistor during manufacturing after the step of removing the oxide layer in the emitter window such that the semiconductor substrate is exposed in the emitter window, and providing a base layer in the emitter window on the semiconductor substrate.

FIG. 7 shows a schematic cross-sectional view of the bipolar junction transistor 20 during manufacturing after the step of removing the oxide layer 28 in the emitter window 40 such that the semiconductor substrate 20 is exposed in the emitter window, and providing a base layer 46 in the emitter window 40 on the semiconductor substrate 20.

For example, the thin oxide layer 28 protecting the collector region 44 can be opened by means of etching and the selective base epitaxial growth can be performed, to obtain the base layer 46.

Figure 8:
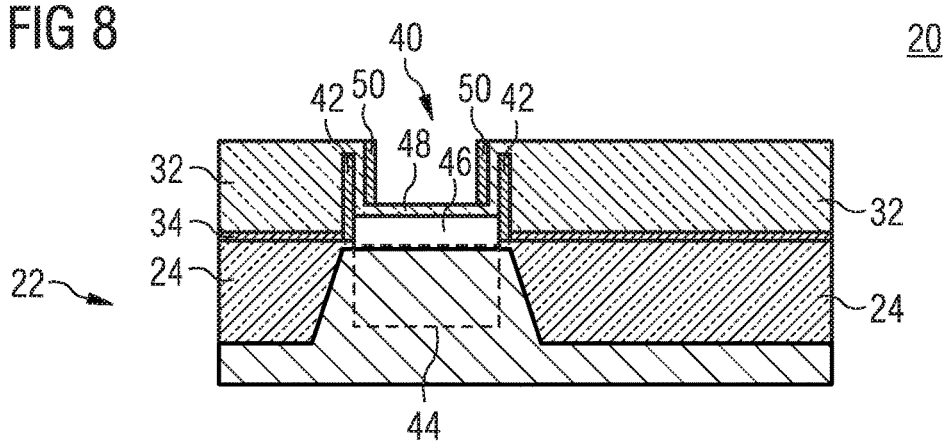
FIG. 8 shows a schematic cross-sectional view of the bipolar junction transistor during manufacturing after the step of providing a second isolation layer on the first isolation layer and the base layer, such that the base layer and the lateral spacers are covered with the second isolation layer, and after providing further lateral spacers within the emitter window on sidewalls of the emitter window that are covered by the second isolation layer.

FIG. 8 shows a schematic cross-sectional view of the bipolar junction transistor 20 during manufacturing after the step of providing a second isolation layer 48 on the first isolation layer 32 and the base layer 46, such that the base layer 46 and the lateral spacers 42 are covered with the second isolation layer 48, and after providing further lateral spacers 50 within the emitter window 40 on sidewalls of the emitter window 40 that are covered by the second isolation layer 48.

Further, the method can comprise selectively removing the second isolation layer 48 such that the base layer 46 is partially exposed while maintaining L-shaped parts of the second isolation layer 48 that are covered (or protected) by the further lateral spacers 50.

For example, the spacer that partially separates the base region 46 from emitter can be processed. The second isolation layer (e.g., oxide) 48 and further lateral spacer layer (e.g., nitride thin layers) 50 can be deposited. Afterwards the further lateral spacer layer (e.g., nitride layer) 50 can be anisotropically etched (to obtain the lateral spacers 50) and subsequently the second isolation layer (e.g., oxide layer) 48 can be etched isotropically. The remaining part of the second isolation layer (e.g., oxide spacer) has a so-called L-shape. The foot of the "L" is formed by the further lateral spacer (vertical remaining nitride) 50.

The above described method provides a fully single-crystalline bipolar junction (e.g., heterojunction) device 20 that is fully self-aligned to diffusion region. The method does not require an emitter window patterning. Further, the method allows arbitrary dopant tuning in the base link region.

The method 10 improves the high-frequency performance of a heterojunction bipolar transistor (e.g., SiGe-heterojunction bipolar transistor (HBT)). In particular, to improve the figure of merit maximum switching frequency (fmax), the amount of at least one out of parasitic resistances and capacitances can be reduced. Further, the base width of the transistor can be kept at a low (or even minimum) value. The method provided at least the following two improvements. First, the method provides a heterojunction bipolar transistor which is completely self-aligned. Thereby, the method does not require a patterning of the emitter window that has to be aligned to the diffusion area. This is not required here. Second, the method allows a direct fabrication of a highly doped base link region by a very short timed selective epitaxy. Thereby, no thermal diffusion step is required which is disadvantageous for a small base width.

Subsequently, two exemplary ways of finishing the emitter are described with respect to FIGS. 9 to 25. Thereby, FIGS. 9 to 16 show a realization of the emitter module with inner spacer removal, wherein FIGS. 17 to 25 show the manufacturing of the emitter module without removal of the inner spacer (this scheme allows to create a tighter emitter and to bring the silicide even closer to the base link, further minimizing the base resistance). The main idea of utilizing the pad (e.g., STI pad nitride) 26 to define the emitter window 40 remains common for both examples.

Figure 9:
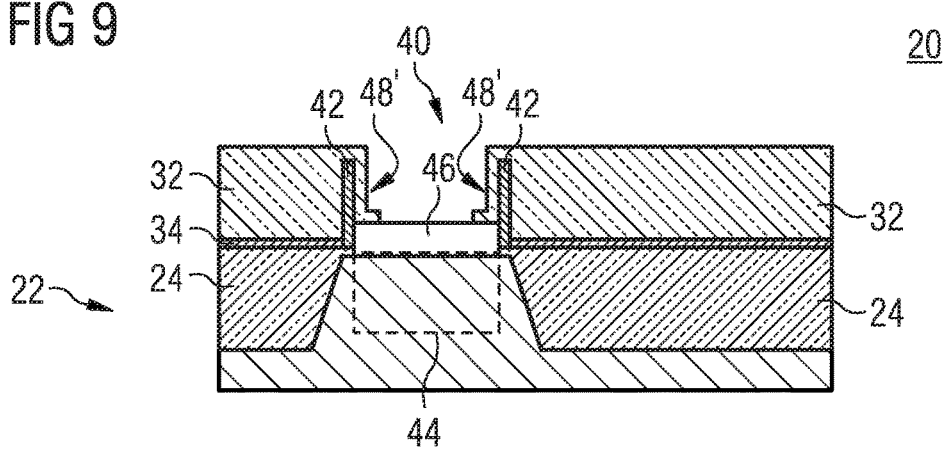
FIG. 9 shows a schematic cross-sectional view of the bipolar junction transistor during manufacturing after the step of selectively removing the further lateral spacers, such that the L-shaped parts of the second isolation layer that were covered by the further lateral spacers are exposed within the emitter window.

FIG. 9 shows a schematic cross-sectional view of the bipolar junction transistor 20 during manufacturing after the step of selectively removing the further lateral spacers 50, such that the L-shaped parts of the second isolation layer 48 that were covered by the further lateral spacers 50 are exposed within the emitter window 40.

For example, the further lateral spacers (e.g., inner nitride spacer) 50 that were used to form the foot of the "L" can be etched off, e.g., using an isotropic etch. This also causes the recess of the later spacers (outer collector-base nitride spacer) 42.

Figure 10:
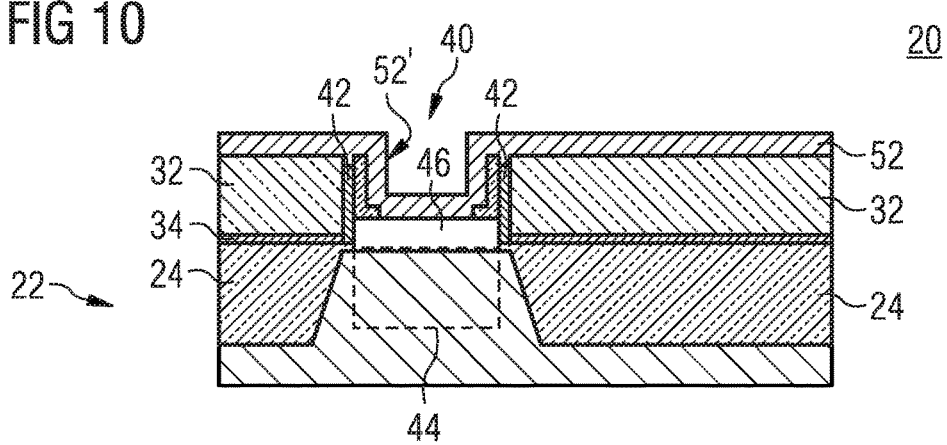
FIG. 10 shows a schematic cross-sectional view of the bipolar junction transistor during manufacturing after the step of providing an emitter layer on the first isolation layer and in the emitter window, such that the emitter layer covers the exposed part of the base layer and the L-shaped parts of the second isolation layer.

FIG. 10 shows a schematic cross-sectional view of the bipolar junction transistor 20 during manufacturing after the step of providing an emitter layer 52 on the first isolation layer 32 (or second isolation layer 48, if remaining or applicable) and in the emitter window 40, such that the emitter layer 52 covers the exposed part of the base layer 46 and the L-shaped parts 48' of the second isolation layer 48.

Since the emitter layer 52 covers the exposed part of the base layer 46 and the L-shaped parts 48' of the second isolation layer 48, the emitter layer 52 comprises a recess (U-shape) 52' in the emitter window 40.

For example, the emitter (layer) 52 can be deposited. Over the monocrystalline base 46 the emitter 52 can be grown epitaxially. Over other region the growth will be amorphous or polycrystalline.

Figure 11:
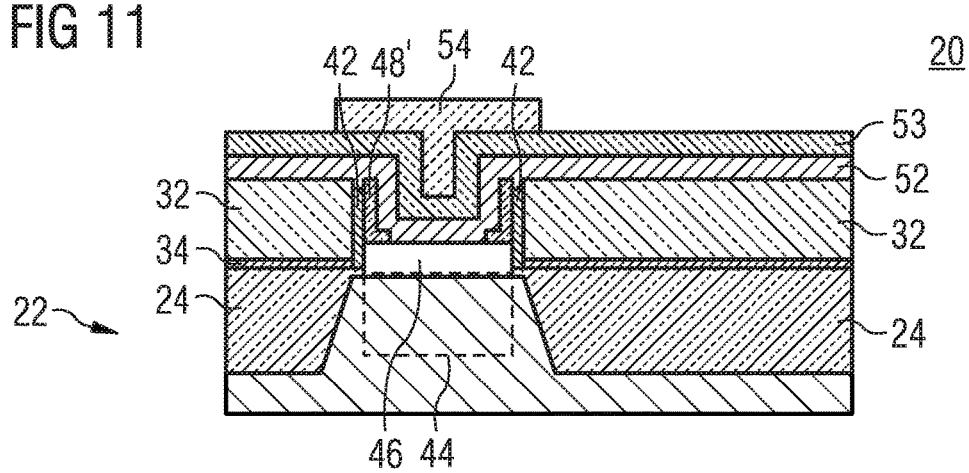
FIG. 11 shows a schematic cross-sectional view of the bipolar junction transistor during manufacturing after the step of providing a sacrificial layer on the emitter layer, and providing a structured mask layer on the sacrificial layer.

FIG. 11 shows a schematic cross-sectional view of the bipolar junction transistor 20 during manufacturing after the step of providing a sacrificial layer 53 on the emitter layer 52, and providing a structured mask layer 54 on the sacrificial layer 53.

As shown in FIG. 11, the sacrificial layer 53 comprises a recess (U-shape) due to the emitter window 40, or more precisely, the recess 52' of the emitter layer 52. Further, the mask layer 54 can be provided such that the recess of the sacrificial layer 53 is overfilled. Furthermore, the mask layer 54 can be structured such that the structured mask layer 54 covers the lateral spacers 42 and the area between them.

For example, the sacrificial layer (e.g., protective oxide) 53 can be deposited and emitter shaping structured mask layer (e.g., lithographic mask) 54 can be applied.

Figure 12:
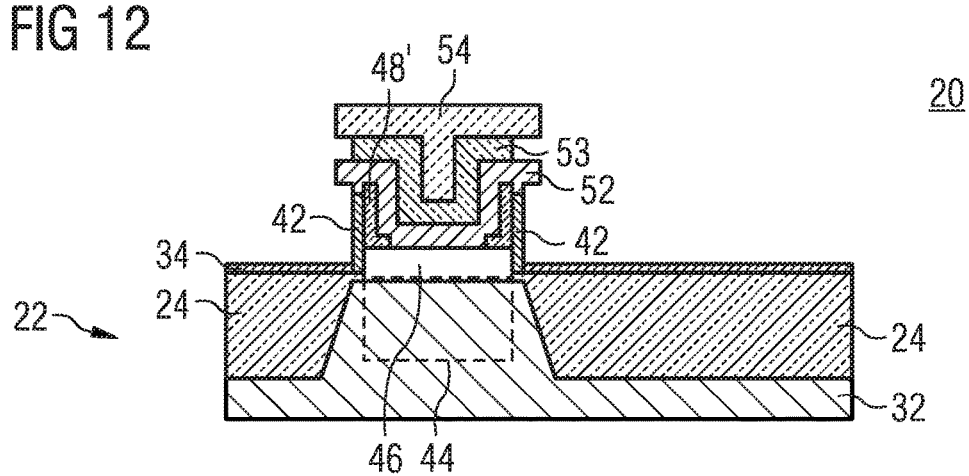
FIG. 12 shows a schematic cross-sectional view of the bipolar junction transistor during manufacturing after the step of removing all layers up to the seed layer that are not covered by the structured mask layer.

FIG. 12 shows a schematic cross-sectional view of the bipolar junction transistor 20 during manufacturing after the step of removing all layers up to the seed layer 34 that are not covered by the structured mask layer 54. In detail, non-covered parts of the sacrificial layer 53, the emitter layer 52 and the first isolation layer 32 are removed up to the seed layer 34, such that the lateral spacers 42 are exposed.

For example, the stack comprising the sacrificial layer (e.g., protective oxide), emitter layer (e.g., poly silicon) 52, and first isolation layer (e.g., oxide) 32 is etched down to the seed layer (e.g., poly) 34. Also the oxide underneath the emitter 52 can be removed. Such etch can be done either by wet etch only due to its high selectivity to material or by a combination of the dry- and wet etches.

Figure 13:
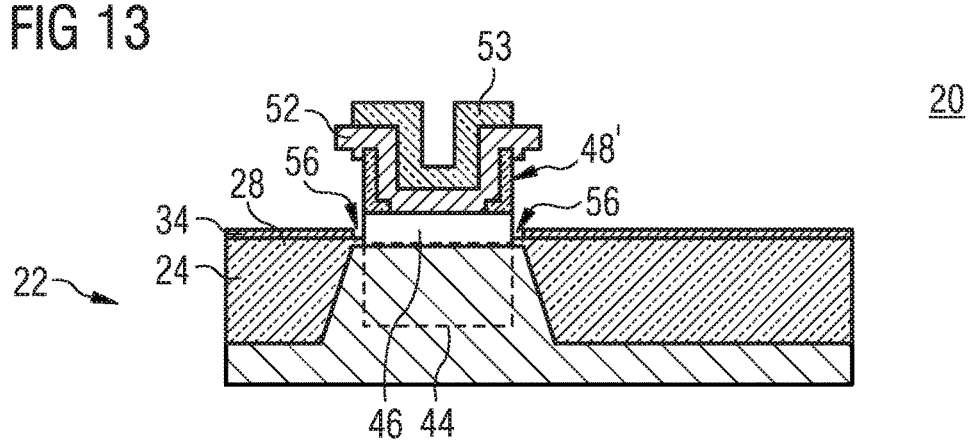
FIG. 13 shows a cross-sectional-view of the bipolar junction transistor during manufacturing after the step of selectively removing the lateral spacers, such that the base layer is laterally exposed and cavities are formed between the seed layer and the base layer in which the oxide layer is partially exposed.

FIG. 13 shows a cross-sectional-view of the bipolar junction transistor 20 during manufacturing after the step of selectively removing the lateral spacers 42, such that the base layer 46 is laterally exposed and cavities 56 are formed between the seed layer 34 and the base layer 46 in which the oxide layer 28 (above the trench isolation 24) is partially exposed.

For example, the collector-base spacer 42 can be removed by wet nitride etch. The sides of the base 46 are now accessible for fabrication of the base electrode.

Figure 14:
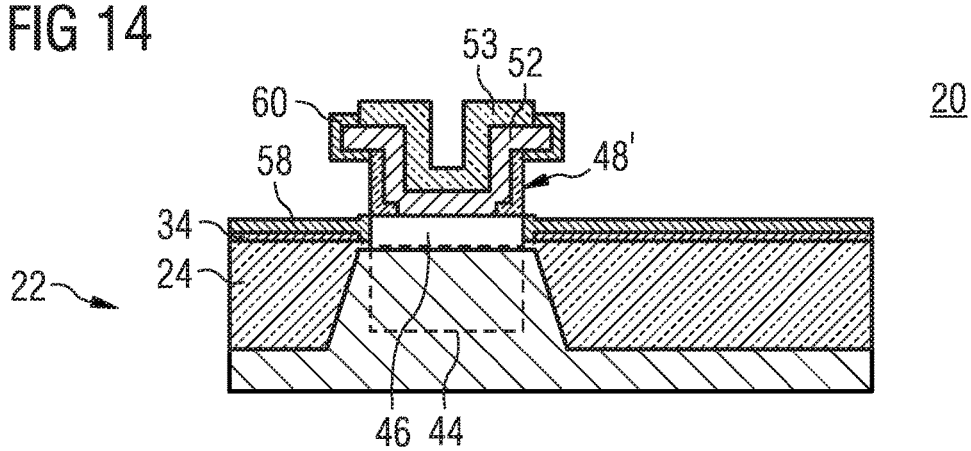
FIG. 14 shows a schematic cross-sectional view of the bipolar junction transistor during manufacturing after the step of providing a base contact layer on the seed layer and the exposed part of the oxide layer, such that the cavities are filled and the base layer laterally contacted.

FIG. 14 shows a schematic cross-sectional view of the bipolar junction transistor 20 during manufacturing after the step of providing a base contact layer 58 on the seed layer 34 and the exposed part of the oxide layer 28, such that the cavities 56 are filled and the base layer 46 laterally contacted. Further, an emitter contact layer 60 can be provided on exposed parts of the emitter layer 52.

For example, the growth of base electrode 56 can be done by means of selective epitaxy. The silicon growth take place only is the regions where silicon is present. In situ p-doped silicon can be used. Additionally, the growth on the sides of the base 46 is monocrystalline since the base 46 itself is monocrystalline. The epitaxial growth will place the dopant atoms immediately at the right lattice positions so that the base link anneal is not necessary. This enables to closely retain the initial dopant profiles of the base.

Figure 15:
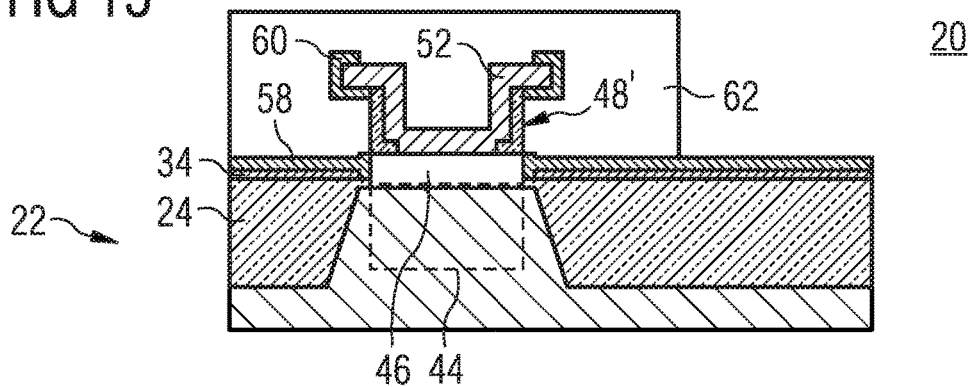
FIG. 15 shows a schematic cross-sectional view of the bipolar junction transistor during manufacturing after the step of providing a structured mask layer on the emitter and parts of the base contact layer.

FIG. 15 shows a schematic cross-sectional view of the bipolar junction transistor 20 during manufacturing after the step of providing a structured mask layer 62 on the emitter 52 and parts of the base contact layer 58. For example, a lithographic mask 62 to shape the base electrode 60 can be applied.

Figure 16:
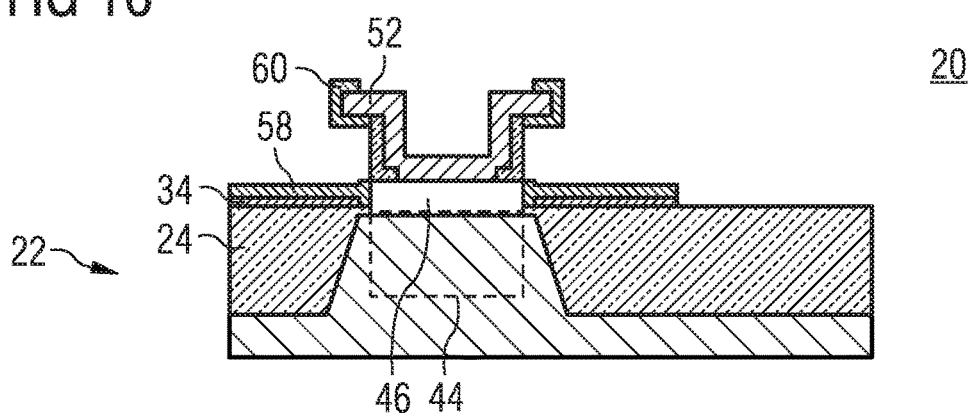
FIG. 16 shows a schematic cross-sectional of the bipolar junction transistor during manufacturing after the step of selectively removing parts of the base contact layer that are not covered by the structured mask layer, and selectively removing the structured mask layer.

FIG. 16 shows a schematic cross-sectional of the bipolar junction transistor 20 during manufacturing after the step of selectively removing parts of the base contact layer 58 that are not covered by the structured mask layer 62, and selectively removing the structured mask layer 62.

For example, the base electrode 58 can be etched and the mask 60 can be removed. The transistor is ready for silicide and further interconnect fabrication.

Subsequently, the manufacturing of the emitter module without removal of the inner spacer will be described with reference to FIGS. 17 to 25.

Figure 17:
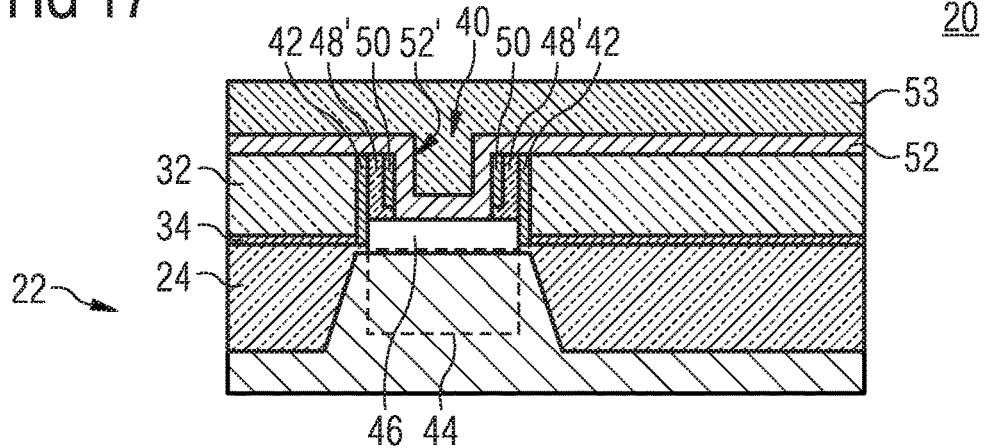
FIG. 17 shows a schematic cross-sectional view of the bipolar junction transistor during manufacturing after the step of providing an emitter layer on the first isolation layer and in the emitter windows such that the emitter layer covers the base layer and the further lateral spacers, and providing a sacrificial layer on the emitter layer thereby overfilling a recess formed by the emitter layer due to the emitter window.

FIG. 17 shows a schematic cross-sectional view of the bipolar junction transistor 20 during manufacturing after the step of providing an emitter layer 52 on the first isolation layer 32 and in the emitter windows 40 such that the emitter layer 52 covers the base layer 46 and the further lateral spacers 50, and providing a sacrificial layer 53 on the emitter layer 52 thereby overfilling a recess 52' formed by the emitter layer 52 due to the emitter window 40.

For example, the emitter 52 can be deposited. Also a sacrificial layer (e.g., oxide protective layer) 53 can be deposited. Oxide thickness has to sufficient to enable later planarization. The further lateral spacers (e.g., nitride inner spacer) 50 was not removed.

Figure 18:
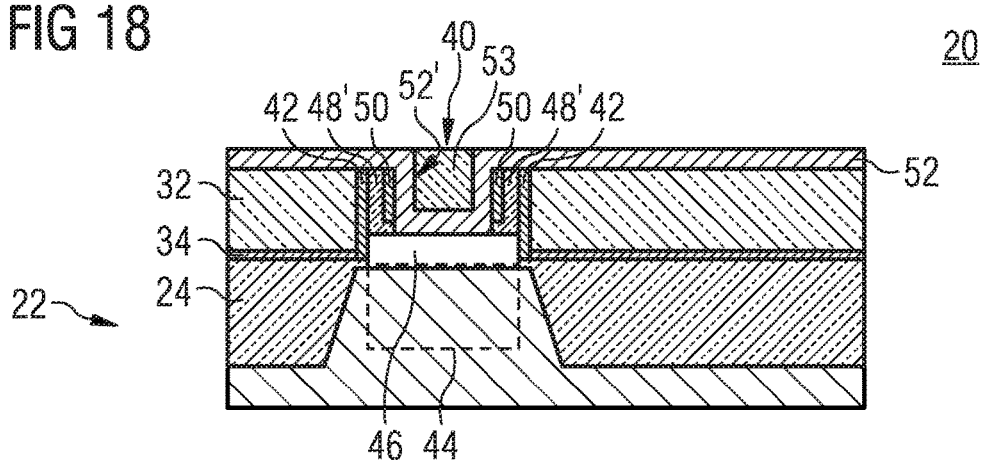
FIG. 18 shows a schematic cross-sectional view of the bipolar junction transistor during manufacturing after the step of selectively removing the sacrificial layer up to the emitter layer while maintaining a part of the sacrificial layer filling the recess of the emitter layer.

FIG. 18 shows a schematic cross-sectional view of the bipolar junction transistor 20 during manufacturing after the step of selectively removing the sacrificial layer 53 up to the emitter layer 52 while maintaining a part of the sacrificial layer 53 filling the recess 52' of the emitter layer.

For example, the sacrificial layer (e.g., oxide) can be planarized, e.g., by CMP to the level of the emitter electrode 52 surface. The inner part of the emitter is however plugged by the sacrificial layer (e.g., oxide).

Figure 19:
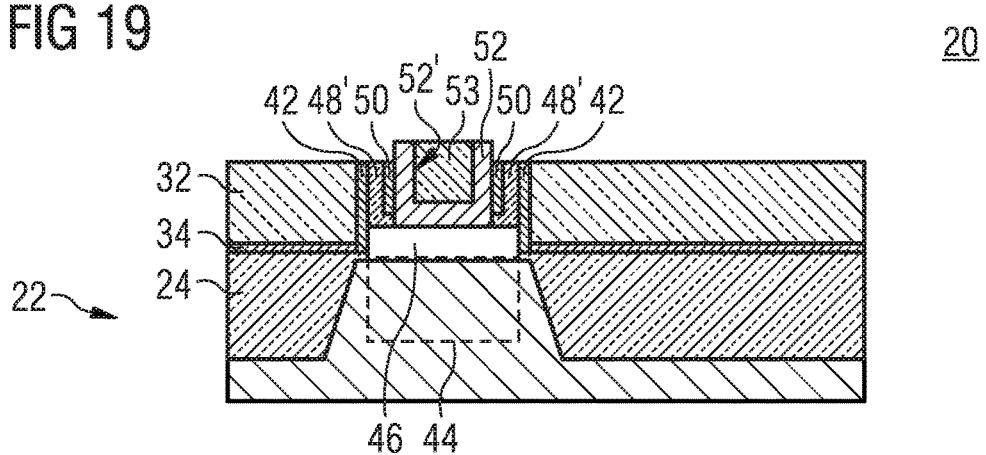
FIG. 19 shows a schematic cross-sectional view of the bipolar junction transistor during manufacturing after the step of selectively removing the emitter layer up to the first isolation layer while maintaining the filled recess of the emitter layer.

FIG. 19 shows a schematic cross-sectional view of the bipolar junction transistor 20 during manufacturing after the step of selectively removing the emitter layer 52 up to the first isolation layer 32 while maintaining the filled recess 52' of the emitter layer 52.

For example, the emitter layer (e.g., poly silicon) 52 can be recessed. The recess depth should slightly exceed the thickness of the emitter outer electrode. Only the inner part of the emitter that is still plugged by the sacrificial layer (e.g., protective oxide) 53 remains not etched.

Figure 20:
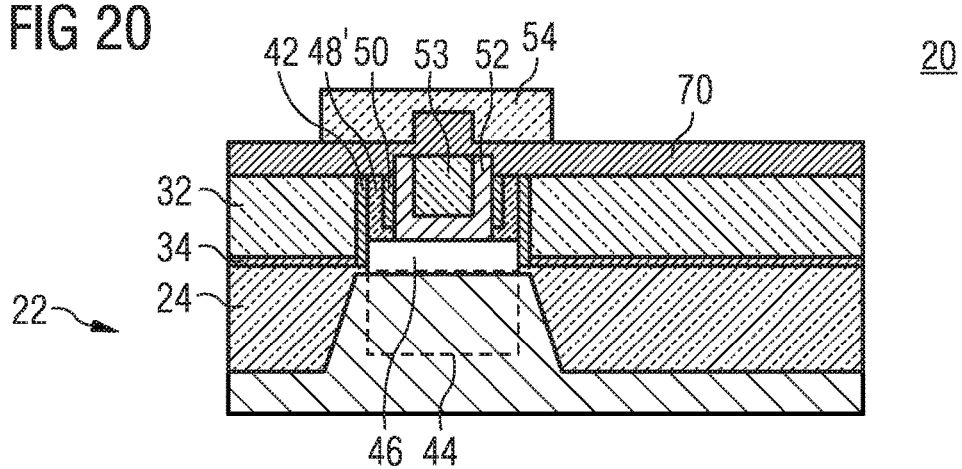
FIG. 20 shows a schematic cross-sectional view of bipolar junction transistor during manufacturing after the step of providing a protective layer on the first isolation layer and the filled recess, and providing a structured mask layer on the protective layer.

FIG. 20 shows a schematic cross-sectional view of bipolar junction transistor 20 during manufacturing after the step of providing a protective layer 70 on the first isolation layer 32 and the filled recess, and providing a structured mask layer 64 on the protective layer 70.

Figure 21:
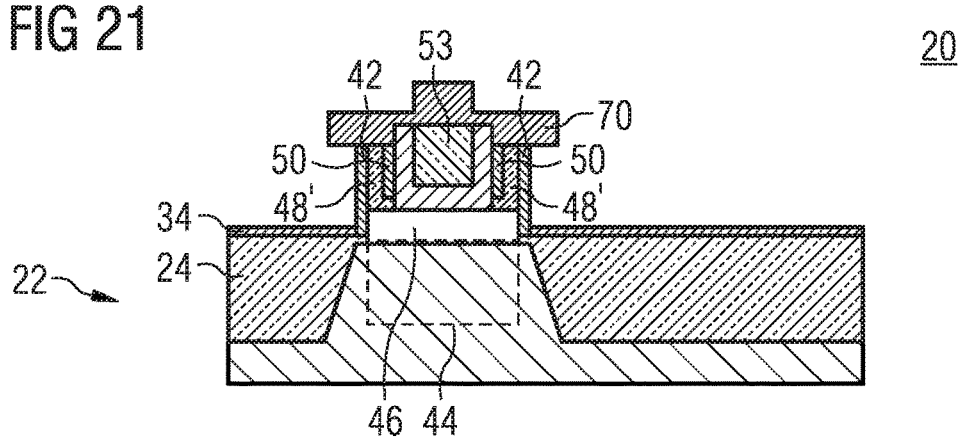
FIG. 21 shows a schematic cross-sectional view of the bipolar junction transistor during manufacturing after the step of removing all layers up to the seed layer that are not covered by the structured mask layer.

For example, the protective layer (e.g. protective nitride) 70 can be deposited and a lithographic mask 54 for shaping of the emitter electrode can be applied FIG. 21 shows a schematic cross-sectional view of the bipolar junction transistor 20 during manufacturing after the step of removing all layers up to the seed layer 34 that are not covered by the structured mask layer 54. In detail, non-covered parts of the protective layer 70 and the first isolation layer 32 are removed up to the seed layer 34, such that the lateral spacers 42 are exposed.

For example, the protective layer (e.g., protective nitride) 70 can be opened by dry etch. The first isolation layer (e.g., oxide) 32 can be removed by either wet etch or by a combination of the wet and dry etches. Further, the mask 54 can be stripped.

Figure 22:
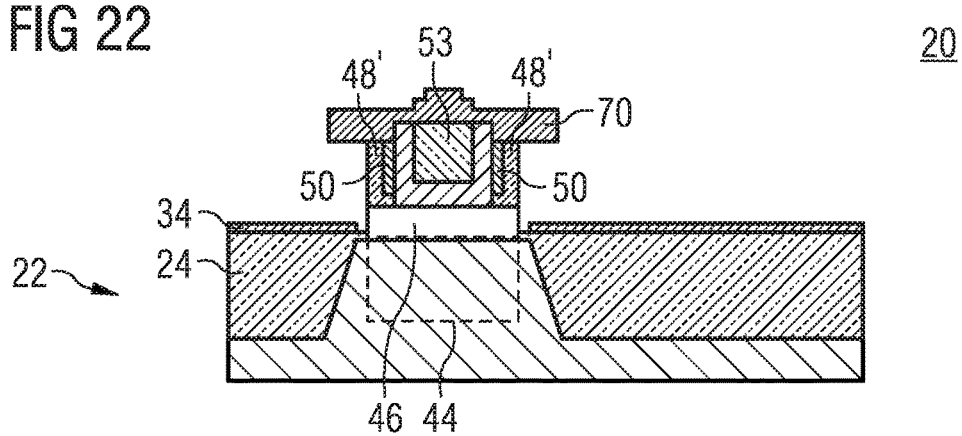
FIG. 22 shows a schematic cross-sectional view of the bipolar junction transistor during manufacturing after the step of selectively removing the lateral spacers, such that the base layer is laterally exposed and cavities are formed between the seed layer and the base layer in which the oxide layer is partially exposed.

FIG. 22 shows a schematic cross-sectional view of the bipolar junction transistor 20 during manufacturing after the step of selectively removing the lateral spacers 42, such that the base layer 46 is laterally exposed and cavities 56 are formed between the seed layer 34 and the base layer 46 in which the oxide layer 28 (above the trench isolation 24) is partially exposed.

For example, the collector-base spacer 42 can be removed by wet nitride etch. The sides of the base 46 are now accessible for fabrication of the base electrode.

FIG. 23 shows a schematic cross-sectional view of the bipolar junction transistor 20 during manufacturing after the step of providing a base contact layer 58 on the seed layer 34 and the exposed part of the oxide layer 28, such that the cavities 56 are filled and the base layer 46 laterally contacted.

For example, the growth of base electrode 56 can be done by means of selective epitaxy. The silicon growth take place only is the regions where silicon is present. In situ p-doped silicon can be used. Additionally, the growth on the sides of the base 46 is monocrystalline since the base 46 itself is monocrystalline. The epitaxial growth will place the dopant atoms immediately at the right lattice positions so that the base link anneal is not necessary. This enables to closely retain the initial dopant profiles of the base.

FIG. 24 shows a cross-sectional view of the bipolar junction transistor 20 during manufacturing after the step of providing a structured mask layer 62 on the emitter 52 and parts of the base contact layer 58.

For example, a lithographic mask 62 to shape the base electrode 60 can be applied.

FIG. 25 shows a cross-sectional view of the bipolar junction transistor 20 during manufacturing after the step of selectively removing parts of the base contact layer 58 that are not covered by the structured mask layer 62, and selectively removing the structured mask layer 62.

For example, the base electrode 58 can be etched and the mask 60 can be removed. The transistor 20 is ready for silicide and further interconnect fabrication.

Subsequently, a method for manufacturing an emitter of a bipolar junction transistor (e.g., a heterojunction bipolar transistor) will be described.

Thereby, one out of the layer stack shown in FIG. 10 and the layer stack without the sacrificial layer 53 shown in FIG. 17 can be used by way of example as starting point for the below described method for manufacturing the emitter. Thereby, the above described method may be used, but does not have to be used, to obtain the required layer stack on which the emitter layer is provided and further processed, i.e., it is not relevant how this layer stack is obtained. Therefore, also any other method capable of providing such a layer stack may be used. However, using the above described method for providing a layer stack having a self-aligned emitter window may result in bipolar junction transistor having improved switching characteristics.

FIG. 26 shows a flowchart of a method 80 for manufacturing a bipolar junction transistor, according to an embodiment. In a first step 82 a layer stack is provided that comprises a semiconductor substrate having a trench isolation; an isolation layer arranged on the semiconductor substrate, wherein the first isolation layer comprises a recess forming an emitter window; lateral spacers arranged on sidewalls of the emitter window; a base layer arranged in the emitter window on the semiconductor substrate; and an emitter layer arranged on the isolation layer, the lateral spacers and the base layer. In a second step 84 a sacrificial layer is provided on the emitter layer thereby overfilling a recess formed by the emitter layer due to the emitter window. In a third step 86 the sacrificial layer is selectively removed up to the emitter layer while maintaining a part of the sacrificial layer filling the recess of the emitter layer. In a fourth step 88 the emitter layer is selectively removed up to the isolation layer while maintaining the filled recess of the emitter layer.

Embodiments use a combination of planarization of the sacrificial layer and emitter recess that define the vertical dimension of the emitter. At the same time, the inner spacer can be re-used as a hard mask that defines the lateral dimension of the emitter.

Subsequently, embodiments of the method 10 for manufacturing a bipolar junction transistor are described in which exemplarily a heterojunction bipolar transistor is manufactured making reference to FIGS. 27A to 34 which show cross-sectional views of the heterojunction bipolar transistor after different manufacturing steps. Thereby, the collector sinker is not shown for simplicity reasons. Further, a standard buried-layer based construction can be used.

FIG. 27A shows a schematic cross-sectional view of the bipolar junction transistor 20 during manufacturing after the step of providing the layer stack. As shown in FIG. 27A, the layer stack comprises a semiconductor substrate 22 having a trench isolation 24, an isolation layer 32 arranged on the semiconductor substrate 22, wherein the first isolation layer 32 comprises a recess forming an emitter window 40, lateral spacers 50 arranged on sidewalls of the emitter window 40, a base layer 46 arranged in the emitter window 40 on the semiconductor substrate 22, and an emitter layer 52 arranged on the isolation layer, the lateral spacers 50 and the base layer 46.

As shown in FIG. 27A, the isolation layer 32 can comprise an L-shape adjacent to the emitter window 40, such that part of the isolation layer 32 adjacent to the semiconductor substrate 22 protrudes between the lateral spacers 50 and the base layer 46.

Further, the layer stack can comprise a base contact layer 58 which is arranged on the semiconductor substrate 22 (or the oxide layer 28 or the seed layer 34 (see FIG. 13 before depositing the base contact layer 58). The isolation layer 32 can be arranged on the base contact layer 58.

FIG. 27B shows a schematic cross-sectional view of the bipolar junction transistor 20 during manufacturing after the step of providing the layer stack 21. In contrast to FIG. 27B, the emitter window 40 is plugged.

In other words, FIGS. 27A and 27B show a generic heterojunction bipolar transistor. The emitter layer 52 has just been deposited. Narrow emitter windows 40 are plugged by the emitter material (see FIG. 27B). The broader emitter windows 40 are not plugged (see FIG. 27A). The exact transistor 20 appearance and method of manufacturing up to this is stage are insignificant. However, important is that the layer used do define the emitter spacer is not etched away. For example, the L-shape of the emitter-base spacer 48' out of oxide can be used. The foot of the L-shaped emitter-base spacer (see also the L-shaped parts 48' of the second isolation layer 48 shown in FIG. 10) can be defined by a vertical nitride layer 50. Conventionally, once the foot is formed, the nitride 50 is removed. However, in embodiments, this nitride 50 is maintained or kept as it will serve later as a hard mask for emitter outer patterning. Note that the method 80 is applicable also when the base link is produced after the emitter processing.

For manufacturing the layer stack shown in FIGS. 27A and 27B, the above described method (see, for example, FIGS. 1 to 10) can be used. However, also any other method that is capable of providing the layer stack shown in FIGS. 27A and 27B might be used.

FIG. 28 shows a schematic cross-sectional view of the bipolar junction transistor 20 during manufacturing after the step of providing a sacrificial layer 53 on the emitter layer 52 thereby overfilling a recess formed by the emitter layer 52 due to the emitter window 40.

Providing the sacrificial layer 53 can comprise depositing the sacrificial layer 53 on the emitter layer 52 thereby overfilling a recess formed by the emitter layer 52 due to the emitter window. The sacrificial layer can be an oxide layer.

For example, a sacrificial layer (or hard mask) 53 can be deposited on top of the emitter 52. The sacrificial layer 53 overfills all emitter topographies and plugs the broader windows 40 up.

Figure 29:
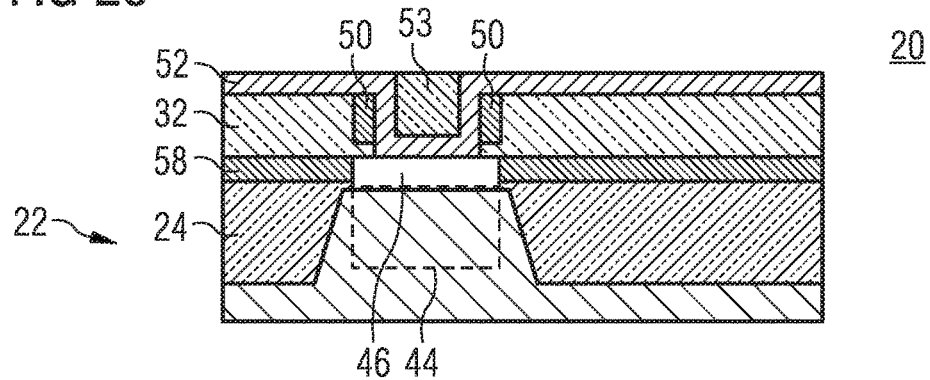
FIG. 29 shows a schematic cross-sectional view of the bipolar junction transistor after the step of removing the sacrificial layer up to the emitter layer while maintaining a part of the sacrificial layer filling the recess of the emitter layer.

FIG. 29 shows a schematic cross-sectional view of the bipolar junction transistor 20 after the step of removing the sacrificial layer 53 up to the emitter layer 52 while maintaining a part of the sacrificial layer 53 filling the recess of the emitter layer 52. Selectively removing the sacrificial layer 53 can comprise planarizing the sacrificial layer 53 up to the emitter layer 52 while maintaining a part of the sacrificial layer 53 filling the recess of the emitter layer 52.

For example, the sacrificial layer can be planarized. The outer parts of the emitter material can be opened to subsequent processing. The inner parts of the broader emitter windows 40 are yet plugged and protected.

Figure 30:
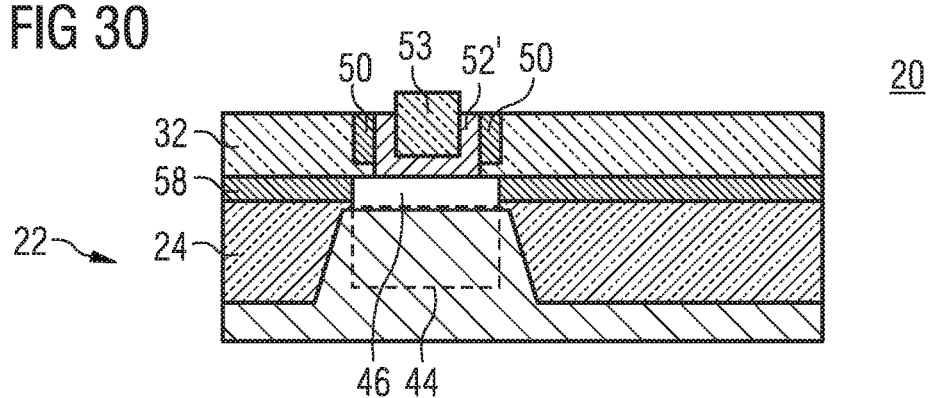
FIG. 30 shows a schematic cross-sectional view of the bipolar junction transistor after the step of selectively removing the emitter layer up to the isolation layer while maintaining the filled recess of the emitter layer.

FIG. 30 shows a schematic cross-sectional view of the bipolar junction transistor 20 after the step of selectively removing the emitter layer 52 up to the isolation layer 32 while maintaining the filled recess 52' of the emitter layer. Selectively removing the emitter layer can comprise dry recessing the emitter layer 52 up to the isolation layer 32 while maintaining the filled recess 52' of the emitter layer.

For example, a dry recess of the emitter material 52 can be performed. In the outer parts where the emitter material 52 is thin it disappears completely. In the emitter windows 40 that are plugged either by the emitter itself or by the sacrificial layer 53 the emitter 40 remains as it should.

Figure 31:
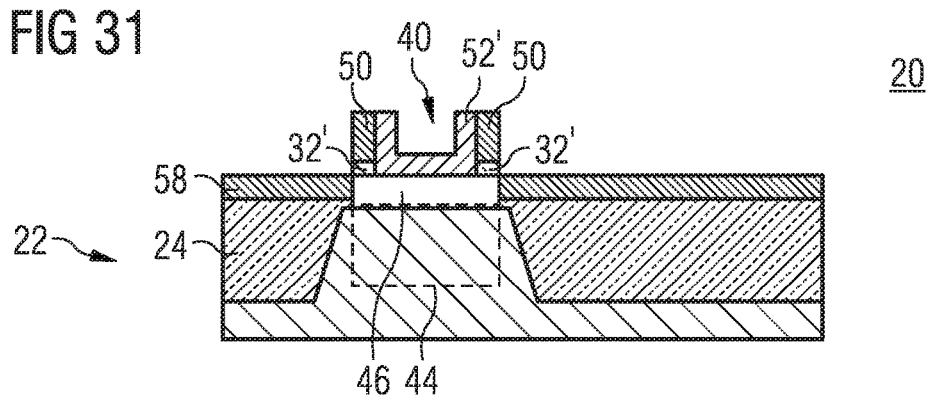
FIG. 31 shows a schematic cross-sectional view of the bipolar junction transistor after the step of selectively removing the isolation layer and the part of the sacrificial layer filling the recess of the emitter layer.

FIG. 31 shows a schematic cross-sectional view of the bipolar junction transistor 20 after the step of selectively removing the isolation layer 32 and the part of the sacrificial layer 53 filling the recess 52' of the emitter layer. Selectively removing the isolation layer 32 and the part of the sacrificial layer 53 filling the recess 52' of the emitter layer can comprise anisotropically etching the isolation layer 32 and the part of the sacrificial layer 53 filling the recess 52' of the emitter layer.

As already mentioned, an also shown in FIGS. 27A to 30, the isolation layer 32 can comprise an L-shape adjacent to the emitter window 40, such that part of the isolation layer 32 adjacent to the semiconductor substrate 22 protrudes between the lateral spacers 50 and the base layer 46.

Thereby, selectively removing the isolation layer 32 can comprises selectively removing the isolation layer 32 while maintaining the part 32' of the isolation layer protruding between the lateral spacers 50 and the base layer 46.

For example, the material that was defining the emitter window (i.e., isolation layer 24 and the part of the sacrificial layer 53 filling the recess 52' of the emitter layer, typically oxide) of the transistor can be anisotropically etched. The material 32' underneath the lateral spacers (e.g., nitride) 50 in the inner spacer of the emitter however remains and laterally protects and insulates the emitter.

Figure 32:
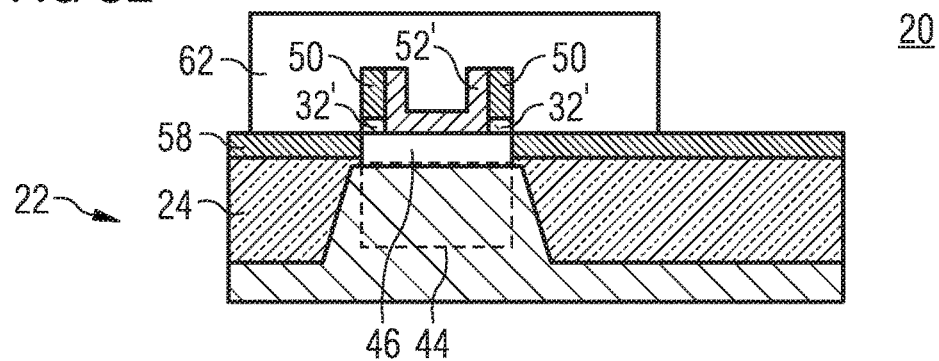
FIG. 32 shows a schematic cross-sectional view of the bipolar junction transistor after the step of providing a mask layer on the base contact layer, the recess of the emitter layer and the lateral spacers, and structuring the mask layer, to obtain a structured mask layer.

FIG. 32 shows a schematic cross-sectional view of the bipolar junction transistor 20 after the step of providing a mask layer 62 on the base contact layer 58, the recess 52' of the emitter layer and the lateral spacers 50, and structuring the mask layer, to obtain a structured mask layer 62. For example, the lithographic mask 62 for base electrode patterning can be applied.

Figure 33:
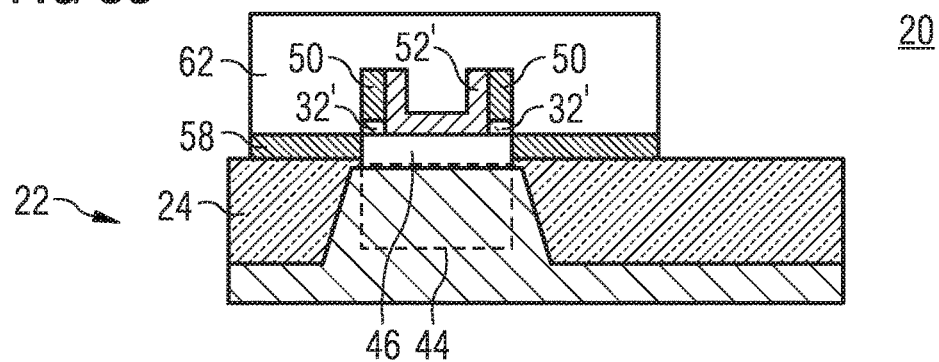
FIG. 33 shows a schematic cross-sectional view of the bipolar junction transistor after the step of removing parts of the base contact layer that are not covered by the structured mask layer.

FIG. 33 shows a schematic cross-sectional view of the bipolar junction transistor 20 after the step of removing parts of the base contact layer 58 that are not covered by the structured mask layer 62. For example, the base electrode 58 can be etched.

Figure 34:
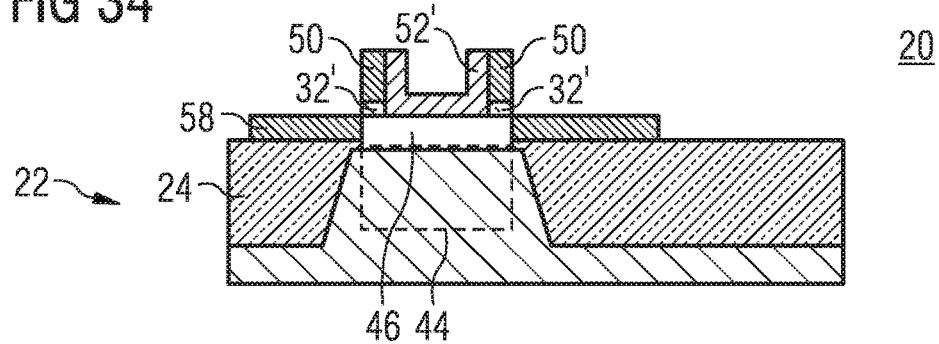
FIG. 34 shows a schematic cross-sectional view of the bipolar junction transistor after the step of removing the structured mask layer.

FIG. 34 shows a schematic cross-sectional view of the bipolar junction transistor 20 after the step of removing the structured mask layer 62. For example, the mask 62 can be removed and active transistor is ready.

The method 80 exemplarily described making reference to FIGS. 27A to 34 provides at least the following four advantages. First, the method 80 provides a way for manufacturing an emitter module that does not necessarily require a special mask and is based on self-aligned combination of CMP and silicon recess etch. Second, the method 80 enables emitter shapes that do not have an overhang. Third, the method 80 enables better vertical access to the base link region and tighter silicidation. Fourth, the method 80 is not limited to narrow emitters and does not require plugging of the emitter window.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for manufacturing a bipolar junction transistor, the method comprising:
  providing a layer stack, the layer stack comprising:
   a semiconductor substrate having a trench isolation;
   an isolation layer arranged on the semiconductor substrate, wherein the isolation layer comprises a recess forming an emitter window;
   lateral spacers arranged on sidewalls of the emitter window;
   a base layer arranged in the emitter window on the semiconductor substrate; and an emitter layer arranged on the isolation layer, the lateral spacers and the base layer;

providing a sacrificial layer on the emitter layer thereby overfilling a recess formed by the emitter layer due to the emitter window;

selectively removing the sacrificial layer up to the emitter layer while maintaining a part of the sacrificial layer filling the recess of the emitter layer; and selectively removing the emitter layer up to the isolation layer while maintaining the filled recess of the emitter layer.

2. The method according to claim 1, wherein providing the sacrificial layer comprises depositing the sacrificial layer on the emitter layer thereby overfilling a recess formed by the emitter layer due to the emitter window.

3. The method according to claim 2, wherein the sacrificial layer is an oxide layer.

4. The method according to claim 1, wherein selectively removing the sacrificial layer comprises planarizing the sacrificial layer up to the isolation layer while maintaining a part of the sacrificial layer filling the recess of the emitter layer.

5. The method according to claim 1, wherein selectively removing the emitter layer comprises dry recessing the emitter layer up to the isolation layer while maintaining the filled recess of the emitter layer.

6. The method according to claim 1, wherein the method comprises selectively removing the isolation layer and the part of the sacrificial layer filling the recess of the emitter layer.

7. The method according to claim 6, wherein selectively removing the isolation layer and the part of the sacrificial layer filling the recess of the emitter layer comprises anisotropically etching the isolation layer and the part of the sacrificial layer filling the recess of the emitter layer.

8. The method according to claim 6, wherein the method comprises structuring a base contact layer which is arranged on the semiconductor substrate, contacts the base layer and is exposed after removing the isolation layer.

9. The method according to claim 8, wherein structuring the base contact layer comprises providing a protective layer on the base contact layer, the recess of the emitter layer and the lateral spacers; structuring the protective layer; and removing parts of the base contact layer that are not covered by the protective layer.

10. The method according to claim 8, wherein the layer stack comprises an oxide layer arranged between the semiconductor substrate and the base contact layer.

11. The method according to claim 1, wherein the isolation layer comprises an L-shape adjacent to the emitter window, such that part of the isolation layer adjacent to the semiconductor substrate protrudes between the lateral spacers and the base layer.

12. The method according to claim 11, wherein selectively removing the isolation layer comprises selectively removing the isolation layer while maintaining the part of the isolation layer protruding between the lateral spacers and the base layer.

* * * * *